(12) United States Patent
Yang et al.

(10) Patent No.: US 11,276,669 B2
(45) Date of Patent: Mar. 15, 2022

(54) HIGH CAPACITY SEMICONDUCTOR DEVICE INCLUDING BIFURCATED MEMORY MODULE

(71) Applicant: WESTERN DIGITAL TECHNOLOGIES, INC., San Jose, CA (US)

(72) Inventors: Xuyi Yang, Shanghai (CN); Shineng Ma, Shanghai (CN); Cong Zhang, Shanghai (CN); Chin-Tien Chiu, Taichung (TW)

(73) Assignee: Western Digital Technologies, Inc., San Jose, CA (US)

( * ) Notice: Subject to any disclaimer, the term of this patent is extended or adjusted under 35 U.S.C. 154(b) by 139 days.

(21) Appl. No.: 16/818,752

(22) Filed: Mar. 13, 2020

(65) Prior Publication Data

US 2020/0411480 A1    Dec. 31, 2020

(30) Foreign Application Priority Data

Jun. 28, 2019 (CN) .......................... 201910575708.2

(51) Int. Cl.
| | |
|---|---|
| *H01L 23/48* | (2006.01) |
| *H01L 25/065* | (2006.01) |
| *H01L 25/18* | (2006.01) |
| *H01L 23/00* | (2006.01) |

(52) U.S. Cl.
CPC .......... *H01L 25/0657* (2013.01); *H01L 24/08* (2013.01); *H01L 25/18* (2013.01); *H01L 2224/08145* (2013.01); *H01L 2225/06524* (2013.01); *H01L 2225/06541* (2013.01); *H01L 2924/1431* (2013.01); *H01L 2924/1433* (2013.01); *H01L 2924/1434* (2013.01)

(58) Field of Classification Search
None
See application file for complete search history.

(56) References Cited

U.S. PATENT DOCUMENTS

| 11,043,472 | B1 * | 6/2021 | Dokania | ............. H01L 23/5389 |
|---|---|---|---|---|
| 2013/0083587 | A1 | 4/2013 | Sekar et al. | |
| 2018/0082981 | A1 * | 3/2018 | Gowda | ............... H01L 23/5385 |

\* cited by examiner

*Primary Examiner* — Hung K Vu
(74) *Attorney, Agent, or Firm* — Vierra Magen Marcus LLP (57) ABSTRACT

A semiconductor device is disclosed including wafers of stacked integrated memory modules. A semiconductor device of the present technology may include multiple memory array semiconductor wafers, and a CMOS controller wafer, which together, operate as a single, integrated flash memory semiconductor device. In embodiments, the CMOS controller wafer may include semiconductor dies comprising ASIC logic circuits integrated together with memory array logic circuits.

20 Claims, 12 Drawing Sheets

Fig. 16

HIGH CAPACITY SEMICONDUCTOR DEVICE INCLUDING BIFURCATED MEMORY MODULE

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives.

Recently, ultra high density memory devices have been proposed using a 3D stacked memory structure having strings of memory cells formed into layers. One such storage device is sometimes referred to as a Bit Cost Scalable (BiCS) architecture. In addition to the layered memory cells, 3D memory devices include a logic circuit for controlling read/write to the memory cells. The logic circuit, often fabricated using complementary metal-oxide-semiconductor (CMOS) technology, may typically be formed beneath stacked memory layers within a semiconductor wafer.

There is currently a significant push to use flash memory devices as solid state drive (SSDs) in datacenters. As the number of memory layers in 3D memory structures increases to meet ever growing datacenter memory demands, it is becoming harder to position the logic circuit beneath the 3D memory cell structure. Additionally, process parameters which are optimized for the memory array formation may not be optimized for the logic circuit formation. For example, it is known heat the 3D memory cell structure in a variety of fabrication steps. While advantageous for the memory cell structure, the heat can adversely affect the operation of the logic circuit.

DETAILED DESCRIPTION

The present technology will now be described with reference to the figures, which, in embodiments, relate to a semiconductor device including wafers of stacked integrated memory modules. A semiconductor device of the present technology may include multiple memory array semiconductor wafers, and a CMOS controller wafer, which together, operate as a single, integrated flash memory semiconductor device. In embodiments, the CMOS controller wafer may include semiconductor dies comprising ASIC logic circuits integrated together with memory array logic circuits. The ASIC logic circuits of the controller wafer dies perform memory management and act as an interface with a host device such as a server or host within a datacenter. The memory array logic circuits of the controller wafer dies include sensor amplifier and peripheral functions, and act as an interface with the memory arrays of the memory array wafer dies.

The controller and memory array wafer dies may be formed with through silicon vias (TSVs) such that, once the controller and memory array wafers are stacked, the TSVs of the respective stacked semiconductor dies may be aligned and affixed to each other to electrically and mechanically connect each of the semiconductor dies in the respective wafers to form the integrated semiconductor device. Further details of the integrated semiconductor device and TSVs according to the present technology are provided below.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5% of a given dimension.

Figure 1:
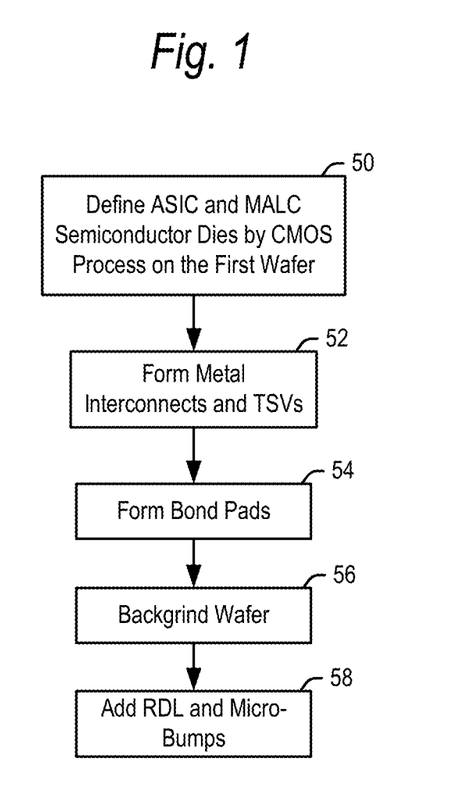
FIG. 1 is a flowchart for forming a first wafer including controller dies according to embodiments of the present technology.
Figure 2:
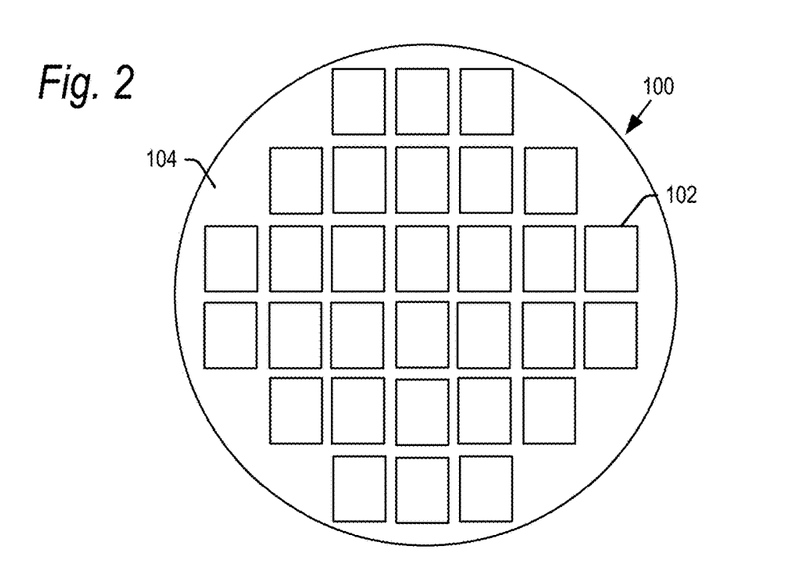
FIG. 2 is a top view of a first major surface of a first semiconductor wafer including controller dies according to embodiments of the present technology.
Figure 3:
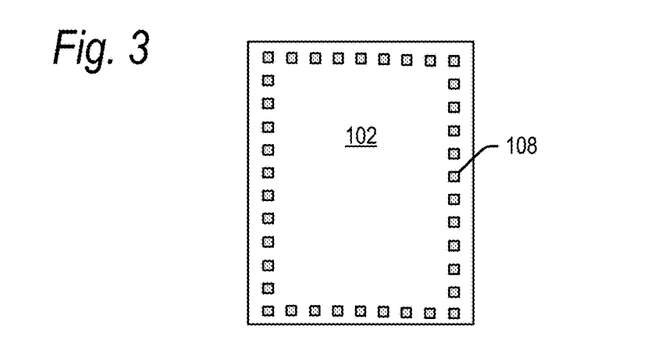
FIG. 3 is a top view of a controller die of the first semiconductor wafer according to embodiments of the present technology.
Figure 4:
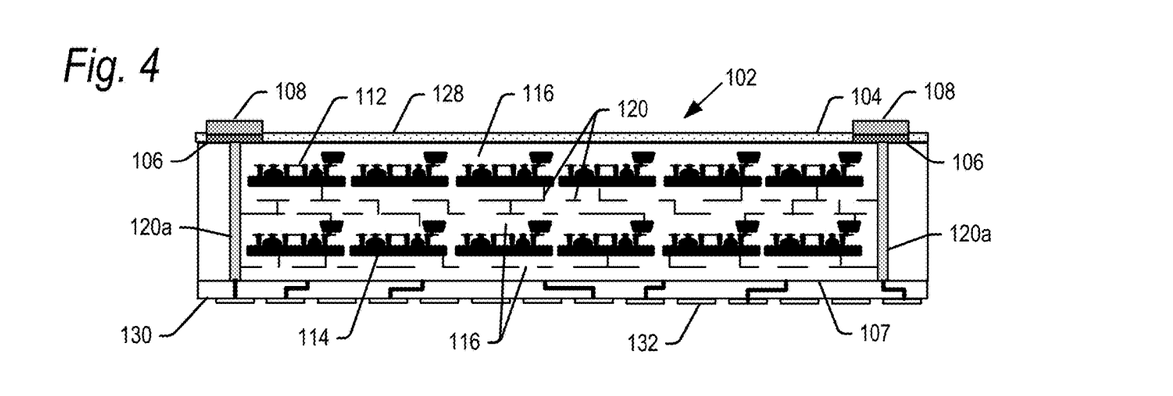
FIG. 4 is a cross-sectional edge view of a controller die of the first semiconductor wafer according to embodiments of the present technology.

An embodiment of a first wafer including controller semiconductor dies will now be explained with reference to the flowchart of FIG. 1, and the views of FIGS. 2-5. In step 50, a first semiconductor wafer 100 may be processed into a number of first semiconductor dies 102 as shown in FIGS. 2-4. These first semiconductor dies 102 may also be referred to herein as controller dies 102, and the first wafer 100 may also be referred to herein as a controller wafer 100. The first semiconductor wafer 100 may start as an ingot of wafer material which may be monocrystalline silicon grown according to either a Czochralski (CZ) or floating zone (FZ) process. However, first wafer 100 may be formed of other materials and by other processes in further embodiments.

The controller wafer 100 may be cut from the ingot and polished on both the first major planar surface 104, and second major planar surface 107 (FIG. 4) opposite surface 104, to provide smooth surfaces. The first major surface 104 may undergo various processing steps to divide the wafer 100 into the respective first semiconductor dies 102, and to form integrated circuits of the respective first semiconductor dies 102 on and/or in the first major surface 104.

In particular, in step 50, the first semiconductor dies 102 may be processed in embodiments to include ASIC logic circuits 112 and memory array logic circuits 114 formed in a dielectric substrate including layers 116 as shown in FIG. 4. FIG. 4 illustrates a cross-section of a single die 102 representative of all dies 102 on the first wafer 100. Further detail of the ASIC logic circuits 112 and memory array logic circuits 114 are described below with reference to FIG. 5, but in general, the ASIC logic circuits 112 perform memory management and act as an interface to control the exchange of data with a host device. The memory array logic circuits 114 includes sensor amplifier (SA) and peripheral (peri) circuits which function as toggle mode interface circuits in order to decode Bitline/Wordline to buffer, and then transfer data between the memory arrays (explained below) and the ASIC logic circuits 112. In embodiments, the ASIC logic circuits 112 may be fabricated in layers of wafer 100 above the memory array logic circuits 114 (from the perspective of FIG. 4). The logic circuits 112, 114 may be fabricated using CMOS technology, though the logic circuits may be fabricated using other technologies in further embodiments. The controller semiconductor dies 102 may include other and/or additional integrated circuits in further embodiments as explained below.

In step 52, multiple layers of metal interconnects and vias 120 may be formed in and through the layers of the semiconductor die 102. These metal interconnects and vias 120 may electrically couple the ASIC logic circuits 112 and memory array logic circuits 114. These metal interconnects and vias 120 may further include a pattern of through-silicon vias (TSVs) 120a extending between the top and bottom major planar surfaces 104, 107 of the first wafer 100.

The TSVs 120a may be formed by etching holes through the first semiconductor dies 102 in the pattern of the finished TSVs 120a. The holes may then be lined with a barrier against diffusion. A seed layer may then be deposited by PVD or CVD, though it may be deposited by other techniques in further embodiments. The seed layer may be formed of copper, aluminum, tin, nickel, gold, alloys thereof or other materials. A conductive material may then be plated onto the seed layer. The conductive material may comprise copper, although other suitable materials such as aluminum, tin, nickel, gold, doped polysilicon, and alloys or combinations thereof may be used.

A passivation layer 128 may be formed on top of the dielectric film layer 116. In step 54, bond pads 108 (FIGS. 3 and 4) may be formed on the passivation layer 128, coupled to the TSVs 120a. The passivation layer 128 may be etched over the TSVs 120a, and the bond pads 108 may be formed over a liner 106. As is known in the art, the bond pads 108 may be formed for example of copper, aluminum and alloys thereof, and the liner 106 may be formed for example of a titanium/titanium nitride stack such as for example Ti/TiN/Ti, though these materials may vary in further embodiments. The bond pads 108 and liners 106 together may have a thickness of 720 nm, though this thickness may be larger or smaller in further embodiments.

In step 56, the controller wafer 100 may be thinned in a backgrind process to define the second major planar (inactive) surface 107 of wafer 100. In step 58, a redistribution layer (RDL) 130 may be formed on the second major planar surface 107 as shown in FIG. 4. The RDL 130 may electrically connect select ones of the bond pads 108 and TSVs 120a to a pattern of micro-bumps 132 distributed across the RDL 130. The micro-bumps 132 can be Cu, AgSn or other metal which can bond between two wafers. The height of the micro-bumps 132 may be about 1 μm to 50 μm, though they may be thinner or thicker than that in further embodiments. The metal interconnects 120 including TSVs 120a may be used to transfer signals and currents between the die bond pads 108 and the ASIC logic circuits 112, and between the memory array logic circuits 114 and the micro-bumps 132.

The number and pattern of semiconductor dies 102 shown on wafer 100 in FIG. 2 is by way of example only. Wafer 100 may include more first semiconductor dies 102, and in different patterns, in further embodiments. Similarly, FIGS. 3 and 4 include a pattern of bond pads 108 on one of the semiconductor dies 102, around a periphery of the semiconductor die 102. However, the pattern of bond pads 108, as well as the number of bond pads 108, on the first semiconductor die 102 in FIGS. 3 and 4 may vary in further embodiments.

Figure 5:
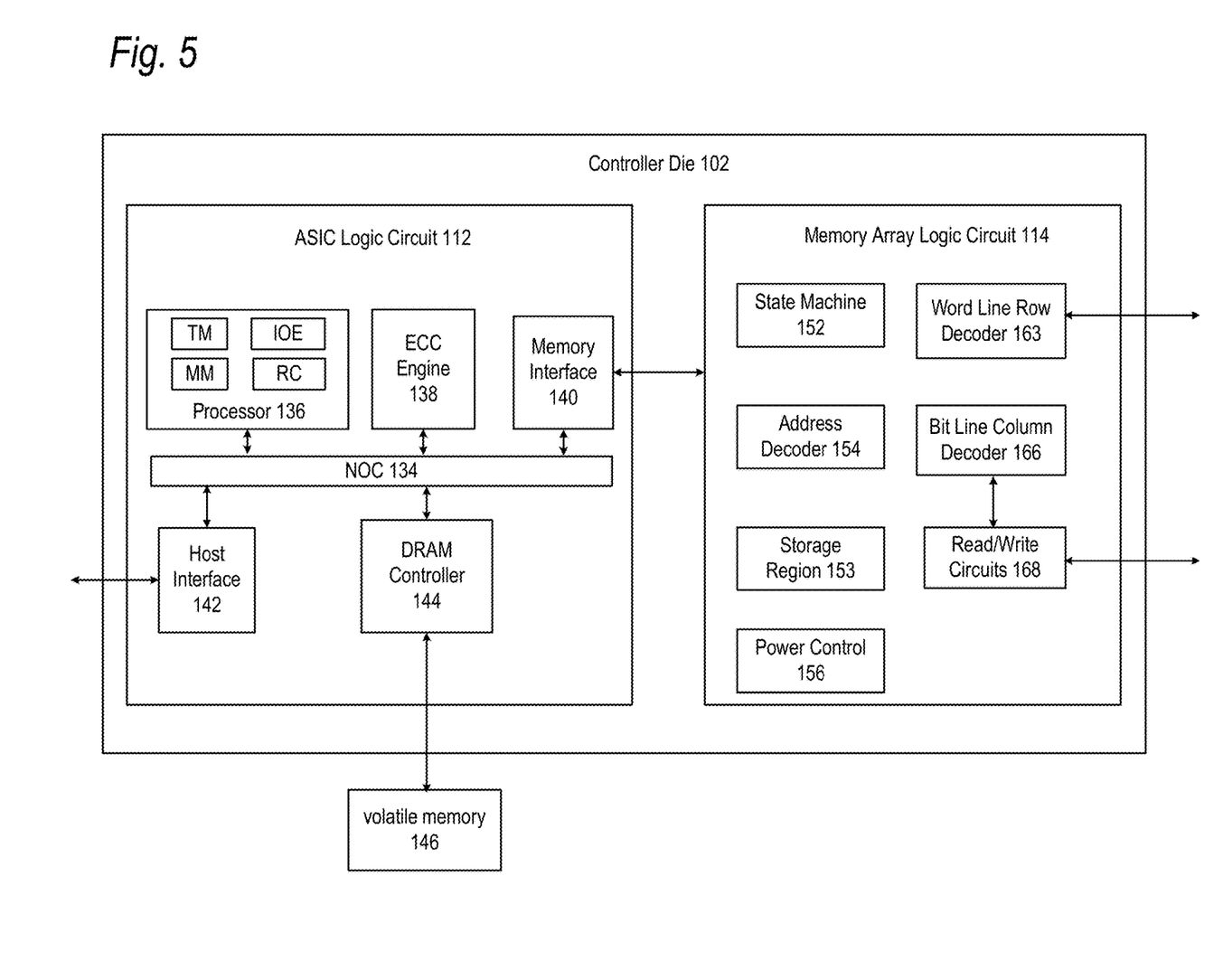
FIG. 5 is a schematic block diagram of a controller die according to embodiments of the present technology.
Figure 13:
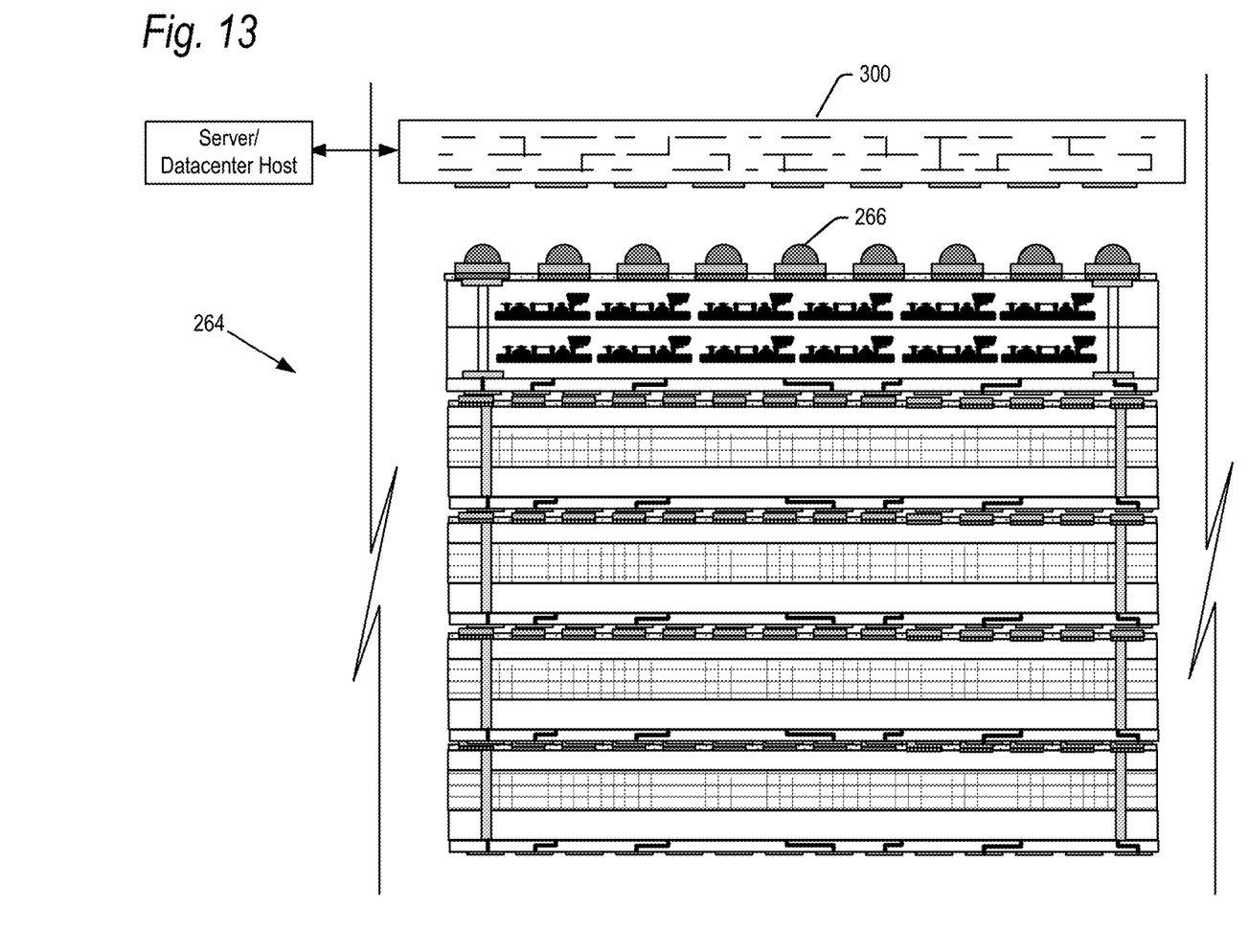
FIG. 13 is a cross-sectional edge view of a memory module of a semiconductor device according to the present technology coupled to a host device.

FIG. 5 is a block diagram showing further detail of the ASIC logic circuit 112 and memory array logic circuit 114 on a controller die 102. The ASIC logic circuit 112 comprises a host interface 142 that is connected to and in communication with a host device 300 (FIG. 13). In one embodiment, host interface 142 provides a PCIe interface. Other interfaces can also be used, such as SCSI, SATA, etc. Host interface 142 is also connected to a network-on-chip (NOC) 134. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 134 are processor 136, ECC engine 138, memory interface 140, and DRAM controller 144. The DRAM controller 144 is used to operate and communicate with local high speed volatile memory 146 (e.g., DRAM). In other embodiments, local high speed volatile memory 146 can be SRAM or another type of volatile memory.

ECC engine 138 performs error correction services. For example, ECC engine 138 performs data encoding and decoding, as per the implemented ECC technique. In one embodiment, ECC engine 138 is an electrical circuit programmed by software. For example, ECC engine 138 can be a processor that can be programmed. In other embodiments, ECC engine 138 is a custom and dedicated hardware circuit without any software. In another embodiment, the function of ECC engine 138 is implemented by processor 136.

Processor 136 performs the various memory operations. For example, memory array module (MM) is a module/process running on processor 136 for performing programming, erasing, reading, as well as memory management processes. Read calibration manager (RC) is a module/process running on processor 136 for performing read calibration processes. In one embodiment, read calibration manager (RC) is implemented as part of ECC Engine 138. Indication of error manager (IOE) is a module/process running on processor 136 for calculating an indication of error, which is used for the calibration of read reference levels. In one embodiment, indication of error manager (IOE) is implemented as part of ECC Engine 138 or as part of read calibration manager (RC).

In one embodiment, processor 136 is programmed by firmware such that read calibration manager (RC) and indication of error manager (IOE) are firmware/software. In other embodiments, processor 136 is a custom and dedicated hardware circuit without any software. Processor 136 (alone or with ECC engine 138) can perform recalibration of read reference levels in order to determine updated read reference levels, including dynamically and adaptively choosing test read reference levels for sensing sample data.

Processor 136 also implements a translation module (TM), as a software/firmware process or as a dedicated hardware circuit. In many systems, the non-volatile memory is addressed internally to the storage system using physical addresses associated with the one or more memory die, discussed below. However, the host system will use logical addresses to address the various memory locations. This enables the host to assign data to consecutive logical addresses, while the storage system is free to store the data as it wishes among the locations of the one or more memory die.

Memory interface 140 communicates with the memory array logic circuit 114. The memory array 212 on the second die 202 (discussed below) may be controlled by memory array logic circuit 114 on the first die 102. The memory array logic circuit 114 may have circuitry used for accessing, controlling and driving memory elements of the memory array to accomplish functions such as programming and reading. The memory array logic circuit 114 cooperates with the read/write circuits 168 to perform memory operations on the memory array. The read/write circuits 168 may include multiple sense blocks (sensing circuitry) that allow a page of memory cells from memory array dies on the memory wafer (explained below) to be read or programmed in parallel.

In embodiments, logic circuit 114 may include a state machine 152, an address decoder 154, and a power control module 156. The state machine 152 provides chip-level control of memory operations. A storage region 153 may be provided for operating the memory array 212 such as programming parameters for different rows or other groups of memory cells. These programming parameters could include bit line voltages and verify voltages.

The address decoder 154 provides an address interface between that used by the host device or the ASIC logic circuit 112 to the hardware address used by the decoders 163 and 166. The power control module 156 controls the power and voltages supplied to the word lines and bit lines during memory operations. It can include drivers for word line layers in a 3D configuration, source side select gates, drain side select gates and source lines. A source side select gate is a gate transistor at a source-end of a NAND string, and a drain side select gate is a transistor at a drain-end of a NAND string.

In accordance with aspects of the present technology, the above-described ASIC logic circuit 112 and memory array logic circuit 114 are integrated into a single semiconductor die 102, and the memory array 212 (described below) is separated out onto its own chip. However, it is understood that some of the above-described functionality of the ASIC logic circuit 112 and memory array logic circuit 114 can be offloaded onto the memory array semiconductor die. Additional components and functionality may be added to the controller die 102 in further embodiments.

Figure 6:
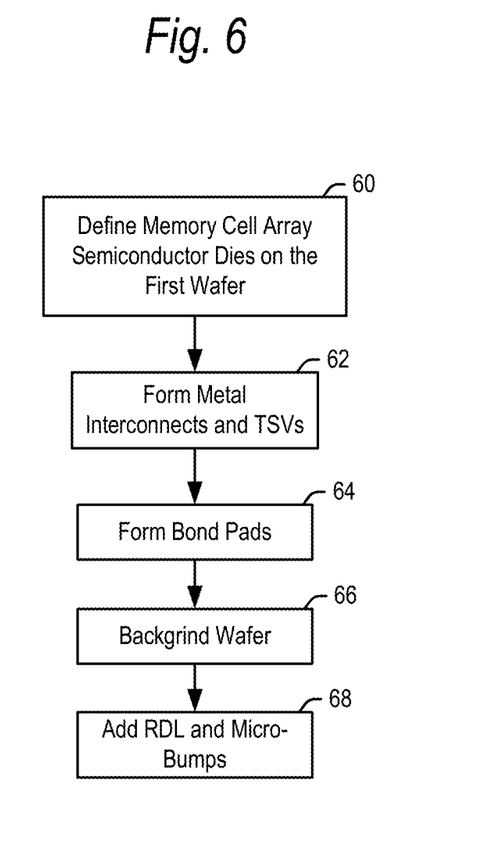
FIG. 6 is a flowchart for forming a second wafer including memory array dies according to embodiments of the present technology.

Before, after or in parallel with the formation of the controller semiconductor dies on first wafer 100, a second semiconductor wafer 200 may be processed into a number of second semiconductor dies 202. Fabrication and operation of the semiconductor dies 202 on wafer 200 will now be explained with reference to the flowchart of FIG. 6 and the views of FIGS. 7-9.

Figure 7:
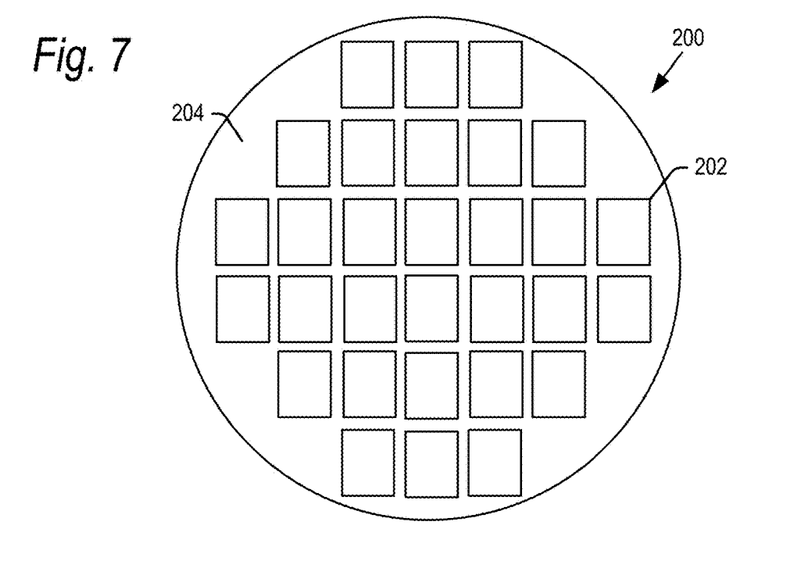
FIG. 7 is a top view of a first major surface of a second semiconductor wafer including memory array dies according to embodiments of the present technology.
Figure 8:
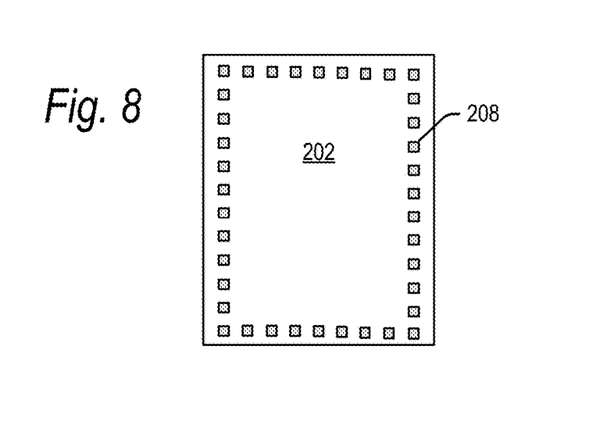
FIG. 8 is a top view of a memory array die of the second semiconductor wafer according to embodiments of the present technology.

FIG. 7 shows a top view of the second semiconductor wafer 200. The second semiconductor wafer 200 may start as an ingot of monocrystalline silicon grown according to either a CZ, FZ or other process. The second semiconductor wafer 200 may be cut and polished on both the first major surface 204, and second major surface 207 (FIG. 9) opposite surface 204, to provide smooth surfaces. The first major surface 204 may undergo various processing steps to divide the second wafer 200 into the respective second semiconductor dies 202, and to form integrated circuits of the respective second semiconductor dies 202 on and/or in the first major surface 204. These second semiconductor dies 202 may also be referred to herein as memory array dies 202, and the second wafer 200 may also be referred to herein as a memory array wafer 200.

Figure 9:
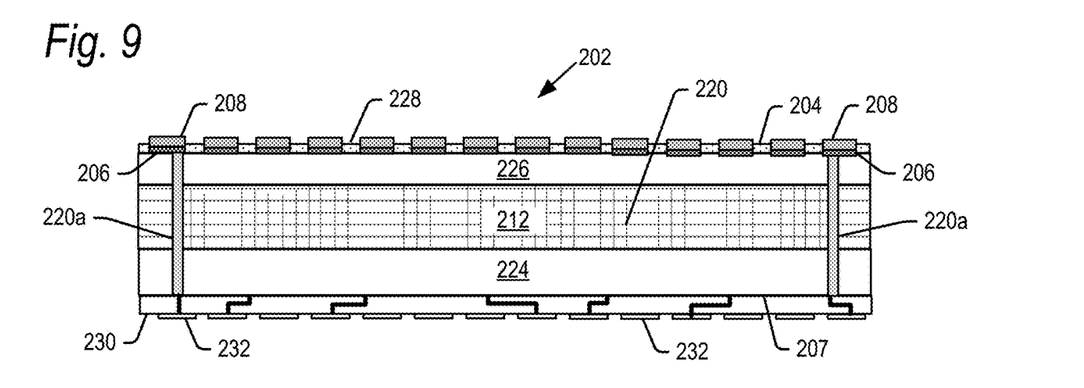
FIG. 9 is a cross-sectional edge view of a memory array die of the second semiconductor wafer according to embodiments of the present technology.

In one embodiment, the memory array dies 202 may be processed in step 60 to include memory array 212 formed in a dielectric substrate including layers 224 and 226 as shown in FIG. 9. FIG. 9 illustrates a cross-section of a single die 202 representative of all dies 202 on wafer 200. Further details of the memory array 212 are provided below, but in general, the memory array 212 may be formed as a 3D stacked memory structure having strings of memory cells formed into layers. However, it is understood that the second semiconductor dies 202 may be processed to include integrated circuits other than a 3D stacked memory structure.

In step 62, multiple layers of metal interconnects and vias 220 may be formed in and through the layers of the semiconductor die 202. These metal interconnects and vias 220 may include a pattern of TSVs 220a extending between the top and bottom major planar surfaces 204, 207 of the second wafer 200.

As in wafer 100, the TSVs 220a in wafer 200 may be formed by etching holes through the second semiconductor dies 202 in the pattern of the finished TSVs 220a. The holes may then be lined with a barrier and a seed layer may then be deposited. A conductive material may then be plated onto the seed layer. The conductive material may comprise copper, although other suitable materials such as aluminum, tin, nickel, gold, doped polysilicon, and alloys or combinations thereof may be used.

A passivation layer 228 may be formed on top of the dielectric film layer 226. In step 64, bond pads 208 (FIGS. 8 and 9) may be formed through the passivation layer 228, coupled to the TSVs 220a. The passivation layer 228 may be etched over the TSVs 220a, and the bond pads 208 may be formed over a liner 206. As noted above for pads 108, the bond pads 208 may be formed for example of copper, aluminum and alloys thereof, and the liner 206 may be formed for example of a titanium/titanium nitride stack such as for example Ti/TiN/Ti, though these materials may vary in further embodiments. The bond pads 208 and liners 206 together may have a thickness of 720 nm, though this thickness may be larger or smaller in further embodiments.

In step 66, the memory array wafer 200 may be thinned in a backgrind process to define the second major planar (inactive) surface 207 of wafer 200. In step 68, a redistribution layer (RDL) 230 may be formed on the second major planar surface 207 as shown in FIG. 9. The RDL 230 may electrically connect select ones of the bond pads 208 and TSVs 220a to a pattern of micro-bumps 232 distributed across the RDL 230. The metal interconnects 220 including TSVs 220a may be used to transfer signals and currents between the memory array 212, the die bond pads 208 and the micro-bumps 232.

The number and pattern of semiconductor dies 202 shown on wafer 200 in FIG. 7 is by way of example only. Wafer 200 may include more memory array semiconductor dies 202, and in different patterns, in further embodiments. Similarly, FIGS. 8 and 9 include a pattern of bond pads 208 on one of the semiconductor dies 202, around a periphery of the semiconductor die 202. However, the pattern of bond pads 208, as well as the number of bond pads 208, on the second semiconductor die 202 in FIGS. 8 and 9 may vary in further embodiments.

The dies 202 of the memory array wafer 200 may each include a memory structure of memory cells, such as an array of memory cells. The array of memory cells 212 (FIG. 9) is addressable by word lines via the row decoder 163 (FIG. 5) and by bit lines via the column decoder 166 from the controller dies 102 on the controller wafer 100. Multiple memory elements in memory array may be configured so that they are connected in series or so that each element is individually accessible. By way of non-limiting example, flash memory systems in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements of memory array may be configured so that each element is individually accessible, e.g., a NOR memory array. NAND and NOR memory configurations are exemplary, and memory elements may be otherwise configured.

The memory array 212 can be two-dimensional (2D) or three-dimensional (3D). The memory array 212 may comprise one or more arrays of memory elements (also referred to as memory cells). A 3D memory array is arranged so that memory elements occupy multiple planes or multiple memory device levels, thereby forming a structure in three dimensions (i.e., in the x, y and z directions, where the z direction is substantially perpendicular, and the x and y directions are substantially parallel, to the major planar surfaces 204, 207 of the memory array dies 102).

Figure 10:
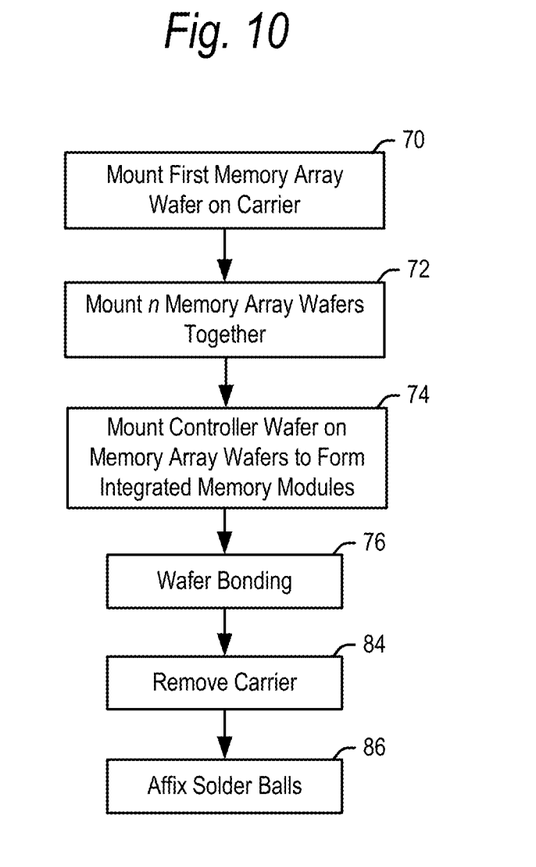
FIG. 10 is a flowchart for forming a semiconductor device according to embodiments of the present technology.

In accordance with aspects of the present technology, one or more memory array wafers 200 may be stacked together with a controller wafer 100 to form a semiconductor device. The structure and fabrication of such a semiconductor device will now be explained with reference the flowchart of FIG. 10 and the views of FIGS. 11-16.

Figure 11:
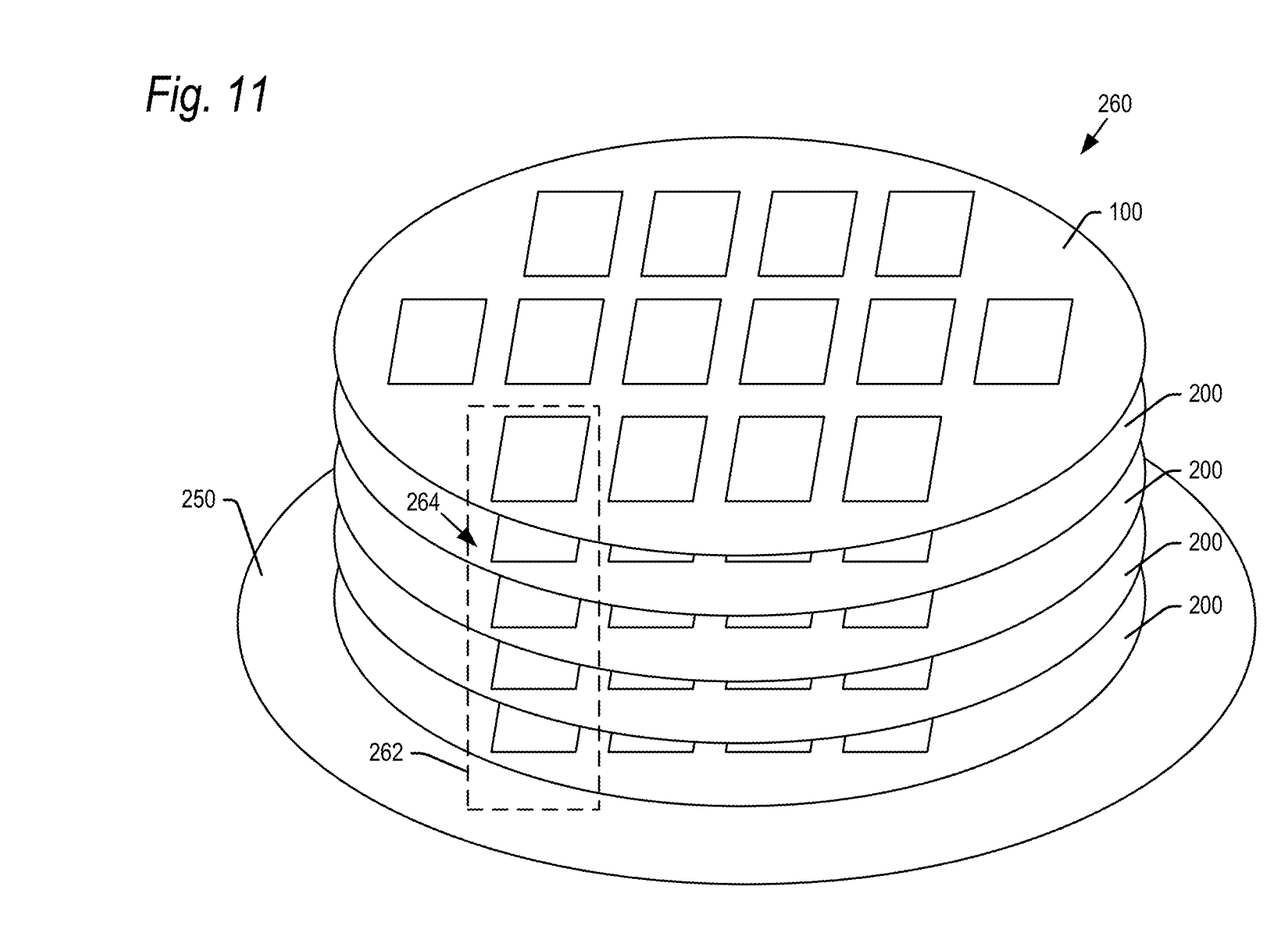
FIG. 11 is a perspective view of a plurality of stacked wafers forming an integrated wafer semiconductor device according to embodiments of the present technology.
Figure 12:
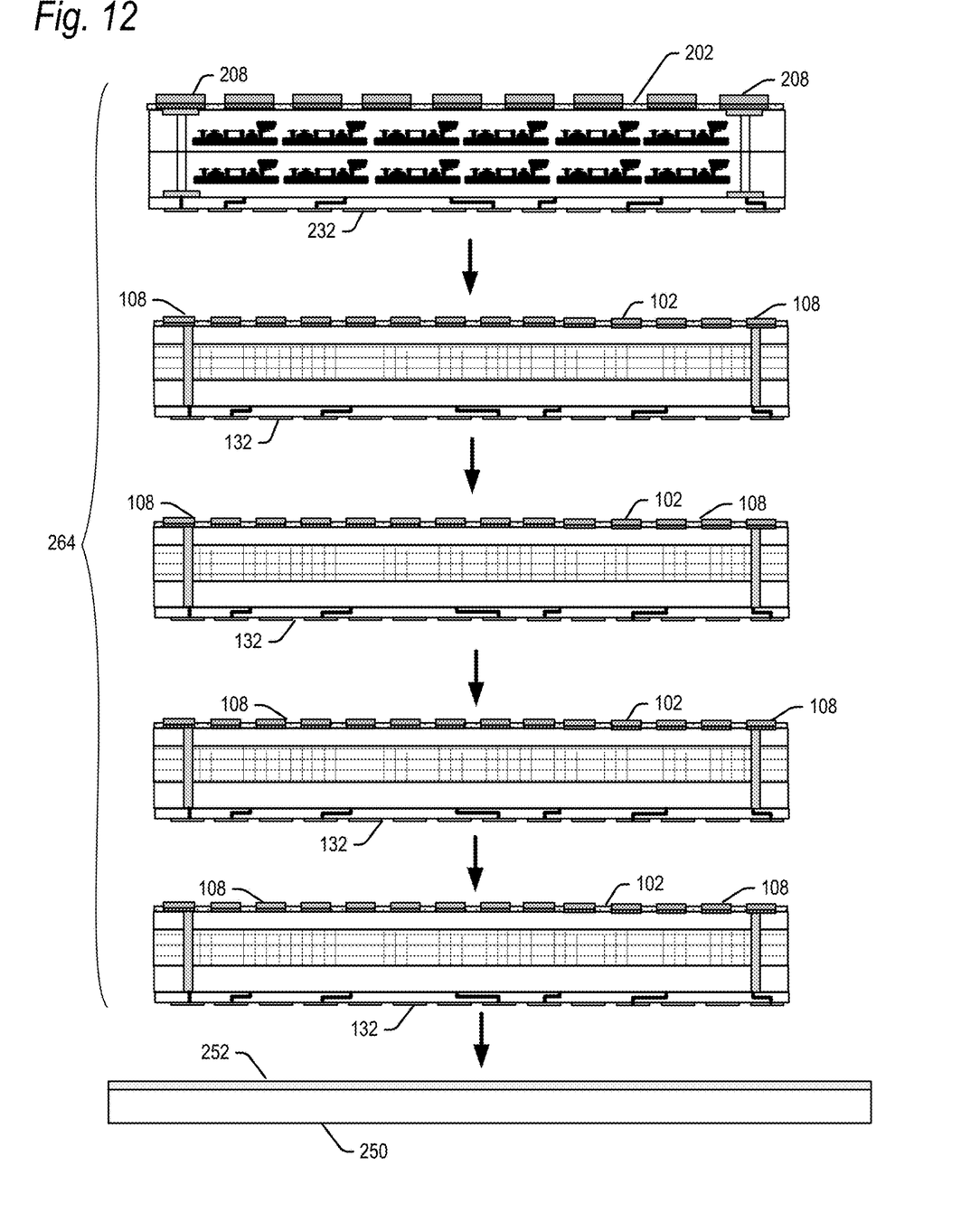
FIG. 12 is an exploded cross-sectional edge view of a plurality of stacked semiconductor dies from wafers forming an integrated wafer memory module according to embodiments of the present technology.

In step 70, a first memory array wafer 200 may be mounted on a temporary carrier, such as temporary carrier 250 shown in FIGS. 11 and 12. The temporary carrier 250 can for example be metal, glass or silicon. The bottom wafer 200 may be adhered to the temporary carrier 250 using a temporary adhesive 252, which can be a laser/UV releasing type film, a thermal releasing type film or a mechanical releasing type film to allow easy detachment as explained below.

In embodiments, the first memory array wafer 200 may be the only memory array wafer used in the semiconductor device. However, in further embodiments, additional memory array wafers 200 may be stacked on the bottom wafer 200 in step 72. In embodiments, there may be n total memory array wafers, where n=1, 2, 4, 8, 16, 32 or other numbers of wafers. The memory array wafers 200 may be aligned and stacked on each other such that the micro-bumps 232 of one wafer mount on top of the bond pads 208 of the next lower wafer.

After the desired number of memory array wafers 200 are stacked on a temporary carrier, a controller wafer 100 may be mounted on the uppermost memory array wafer in step 74 to form a semiconductor device 260 as shown in FIG. 11. The number of memory wafers 200 in FIG. 11 is by way of example only and may vary as noted above.

The controller wafer 100 may be aligned and stacked on the uppermost memory array wafer 200 such that the micro-bumps 132 of the controller wafer 100 mount on top of the bond pads 208 of the uppermost memory array wafer 200. Once all of the wafers 100, 200 have been mounted on a temporary carrier 250, the semiconductor device 260 may be permanently bonded to each other in step 76. This permanent bonding physically attaches the wafers to each other and electrically couples the wafers to each other (specifically, the aligned die bond pads 208 and micro-bumps 132, 232 in the respective dies in the column of wafers). Various known bonding processes may be used to permanently bond the wafers to each other, such as for example fusion bonding and hybrid bonding.

The wafers 100, 200 are stacked in such a way that a column of memory array dies 202 are aligned with each other and a controller die 102 above the column, which acts as a controller for the memory array dies 202 in the column. FIG. 11 shows a dashed-lined box 262 around a column of memory array dies 202 and controller die 102. Each such column of memory array dies 202 and its associated controller die 102 may be referred to herein as a memory module 264. FIG. 12 shows an exploded cross-sectional edge view of a single memory module 264 from the wafers 100, 200 of the semiconductor device 260. As used herein, a semiconductor device may be a single memory module 264, or a semiconductor device may be all of the memory array wafers 200 and controller wafer 100 together.

In step 84, the carrier 250 may be removed by dissolving the temporary adhesive 252. Temporary adhesive 252 may be dissolved using heat, mechanical force, chemicals, a laser or UV light and/or by other methods.

In step 86, solder balls 266 may be affixed to the pads 108 on the upper surface of wafer 100 as shown in FIG. 13. FIG. 13 shows a single memory module 264 including solder balls 266, but solder balls 266 may be provided on the die bond pads 108 of all dies on the upper surface of the controller wafer 100. The solder balls 266 may be used to electrically and mechanically couple the semiconductor device 260 to a host device 300. The host device 300 may for example be a printed circuit board coupled to a server or host within a datacenter. It is understood that the host device 300 may be other devices in further embodiments.

In embodiments, the semiconductor device 260 is formed from whole wafers to provide a high-capacity storage device, useful for example in datacenters or in other high-capacity uses. In further embodiments, the wafers 100, 200 of the semiconductor device 260 may be diced to provide individual memory modules 264. As noted above, each such memory module 264 may comprise a column of one or more memory array dies 202 and a controller die 102 encapsulated in a mold compound. Solder balls 266 may be provided on the die bond pads 108 of the controller die 102 to allow the individual memory module 264 to be affixed to a host device such as a printed circuit board. The semiconductor device 260 may be diced into individual memory modules 264 as by a laser or saw blade.

Figure 14:
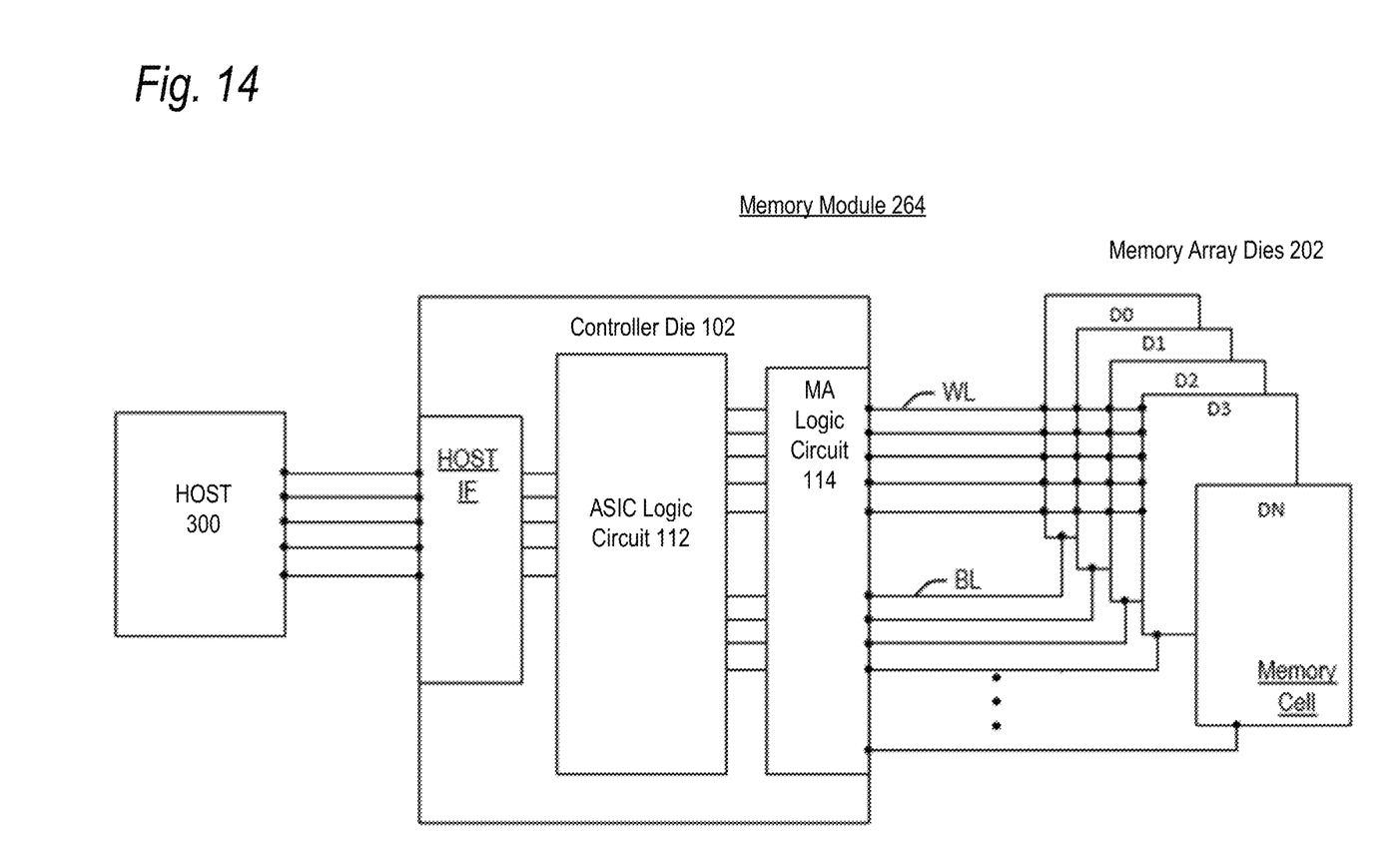
FIG. 14 is a functional block diagram of an memory module according to embodiments of the present technology.

FIG. 14 is a functional block diagram of a single memory module 264 from the semiconductor device 260. As shown, each controller die 102 in wafer 100 controls a column of n memory array dies 202 in the wafers 200. The logic circuits 114 controlling the operation of the memory array dies 202 are integrated together in the controller die 102 with the logic circuits 112 interfacing with the host device 300.

Figure 15:
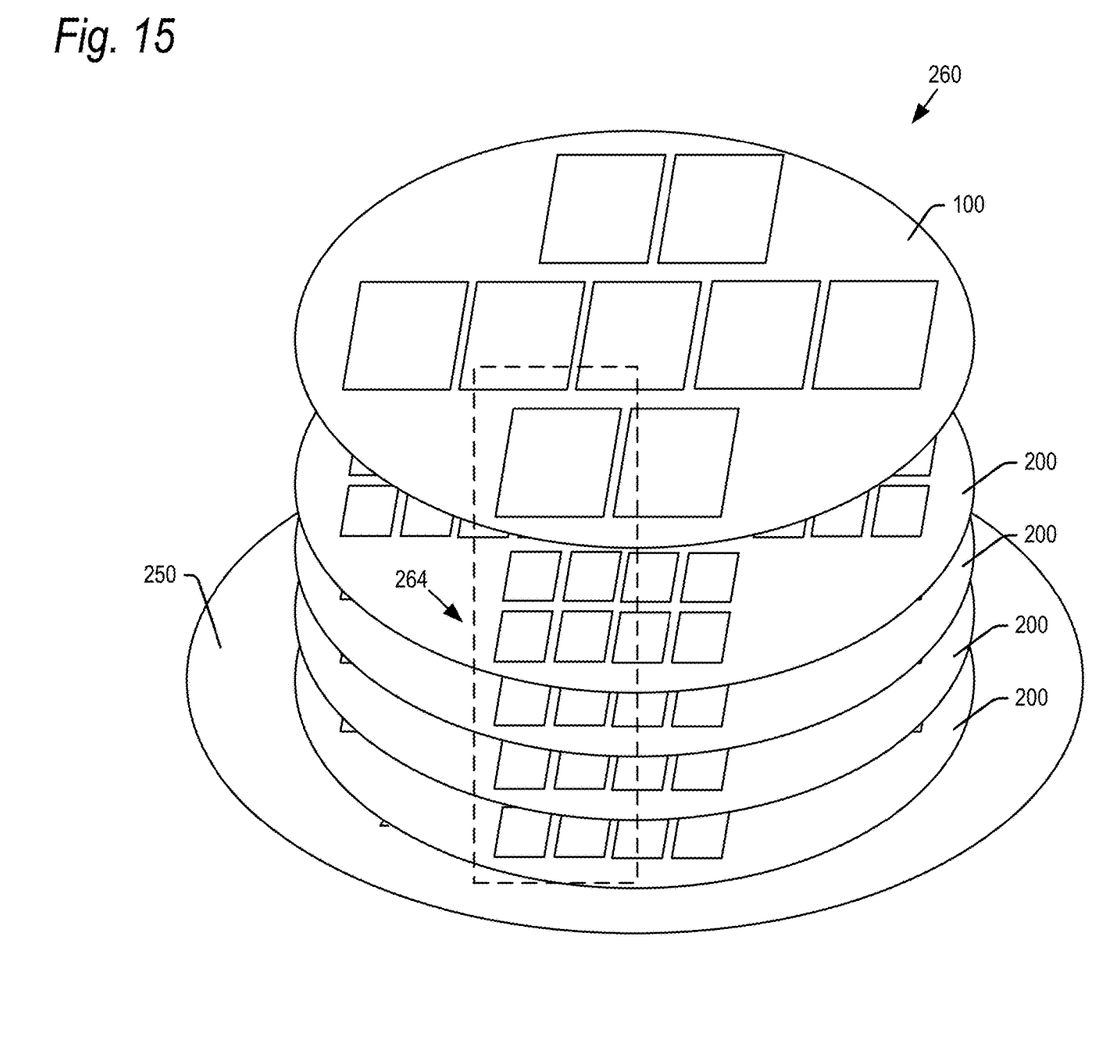
FIG. 15 is a perspective view of a plurality of stacked wafers forming a multichannel integrated wafer semiconductor device according to embodiments of the present technology.
Figure 16:
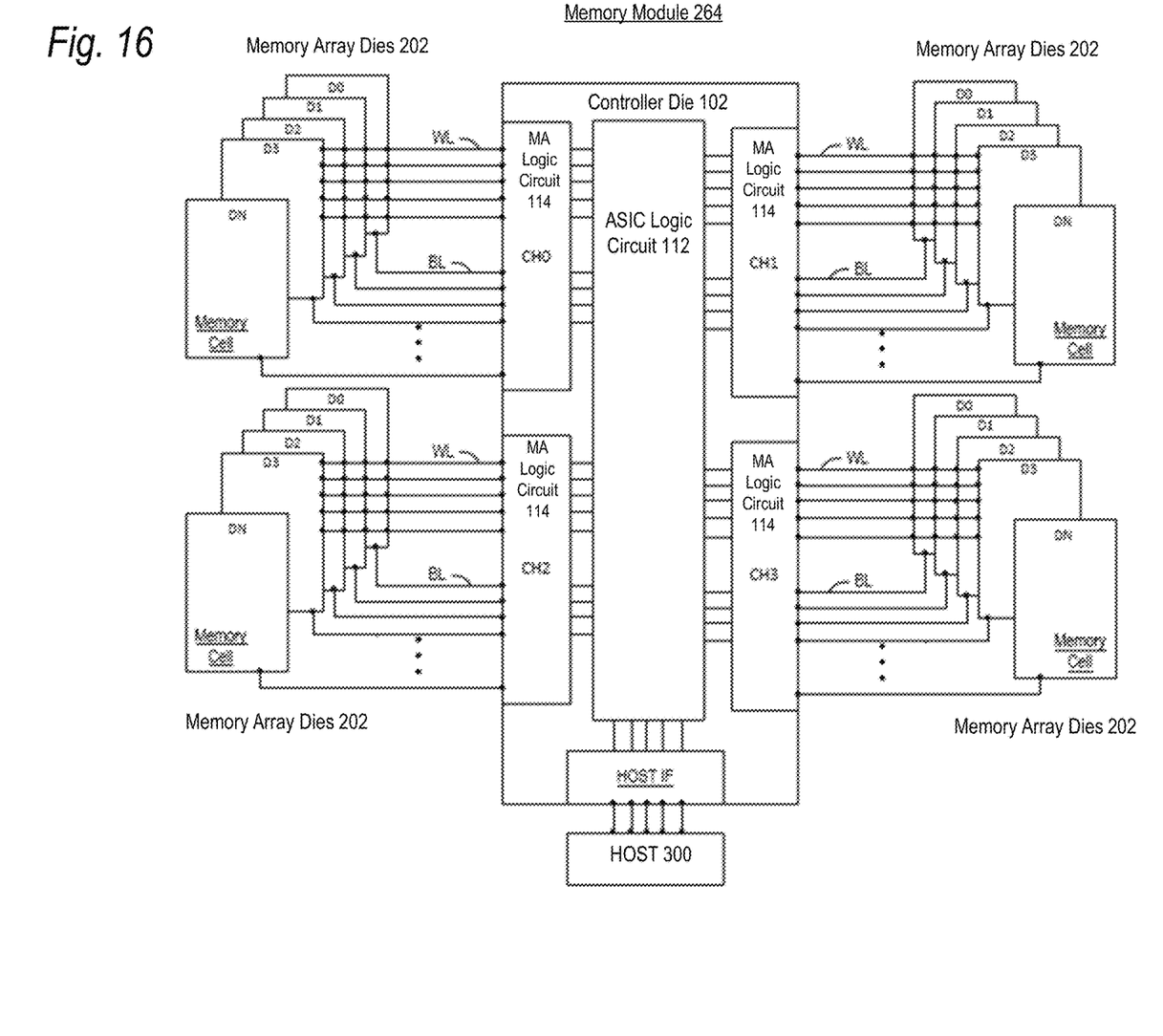
FIG. 16 is a functional block diagram of a multichannel integrated wafer memory module according to embodiments of the present technology.

FIGS. 11-14 illustrate a single channel memory module 264 where a controller die 102 controls a single column of memory dies 202. FIGS. 15 and 16 show an alternative embodiment of the semiconductor device 260 comprising four-channel memory modules 264. As indicated in the view of the wafers 100, 200 in FIG. 15, the control wafer 100 in this embodiment may include fewer controller dies 102 than there are memory array dies 202 in each of the wafers 200. In this example, a single controller die 102 may control four columns of memory array dies 202, as indicated by the dashed-line box 272.

As indicated in the functional block diagram of FIG. 16, the memory array dies 202 on wafers 200 may be the same as that described above. However, in this embodiment, the controller dies 102 of each for channel memory module 264 may have separate memory array logic circuits 114 for each channel. A single ASIC logic circuit 112 may interface with each of the memory array logic circuits 114, and may interface with the host device 300 as described above. In further embodiments, each memory module 264 may be an re-channel device, with the controller die 102 including n memory array logic circuits 114 for controlling the n columns of memory array dies 202.

In embodiments described above, the controller wafer 100 is mounted at the top of the stack of wafers of the semiconductor device 260. However, the controller wafer 100 may be located at other positions in the wafer stack, such as for example at the bottom of the stack, in further embodiments.

In summary, an example of the present technology relates to a semiconductor device configured to operate with a host device, comprising: a first semiconductor die comprising: an ASIC logic circuit configured to interface with the host device, and a memory array logic circuit configured to interface with a memory array; and a group of one or more second semiconductor dies coupled to the first semiconductor die, the group of one or more second semiconductor dies comprising the memory array configured to interface with the memory array logic circuit of the first semiconductor die.

In another example, the present technology relates to a semiconductor device configured to operate with a host device, comprising: a first wafer comprising at least one of logic circuits for interfacing with the host device and logic circuits for interfacing with a memory array; and a plurality of second wafers, physically and electrically coupled to the first wafer, the plurality of second wafers comprising a plurality of memory arrays.

In a further example, the present technology relates to a semiconductor device configured to operate with a host device, comprising: a controller wafer comprising a plurality of controller semiconductor dies, each controller semiconductor die of the plurality of controller semiconductor dies comprising: ASIC logic circuits for interfacing with the host device, memory array logic circuits for interfacing with a memory array; and a plurality of memory array wafers, physically and electrically coupled to the first wafer, the plurality of memory array wafers each comprising a plurality of memory array semiconductor dies having memory arrays.

In another example, the present technology relates to a semiconductor device configured to operate with a host device, comprising: a first semiconductor die comprising: host interface circuit logic means for interfacing with a host device, and memory array circuit logic means for interfacing with memory array means; and a group of one or more second semiconductor dies coupled to the first semiconductor die, the group of one or more second semiconductor dies comprising the memory array means for storing data, the memory array means interfacing with the memory array logic circuit of the first semiconductor die.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device configured to operate with a host device, comprising:
   a first semiconductor die having a major surface and comprising:
      an ASIC logic circuit configured to interface with the host device, the ASIC logic circuit provided at a first elevation along an axis perpendicular to the major surface within the first semiconductor die, and
      a memory array logic circuit configured to interface with a memory array, the memory array logic circuit provided at a second elevation along the axis perpendicular to the major surface within the first semiconductor die, the second elevation being different than the first elevation; and a group of one or more second semiconductor dies coupled to the first semiconductor die along the axis perpendicular to the major surface, the group of one or more second semiconductor dies comprising the memory array configured to interface with the memory array logic circuit of the first semiconductor die.

2. The semiconductor device of claim 1, wherein the first semiconductor die is part of a first wafer, and the group of one or more second semiconductor dies are part of one or more second wafers, wherein the first wafer and the group of one or more second wafers are stacked on each other.

3. The semiconductor device of claim 1, wherein the first semiconductor die is part of a first wafer, and the group of one or more second semiconductor dies are part of one or more second wafers, wherein the first wafer and the group of one or more second wafers are stacked on each other and the first semiconductor die and the group of one or more second semiconductor dies are aligned with each other in a column in the stacked wafers.

4. The semiconductor device of claim 1, wherein the semiconductor device is a single channel device.

5. The semiconductor device of claim 1, wherein the semiconductor device is a multiple channel device.

6. The semiconductor device of claim 5, wherein the first semiconductor die comprises a memory array logic circuit for each channel of the multiple channels.

7. The semiconductor device of claim 1, wherein the first die and the group of one or more second dies are electrically coupled by through silicon vias in the first die and the group of one or more second dies.

8. The semiconductor device of claim 1, wherein the first semiconductor die comprises a set of bond pads on a first surface configured to mate with contacts of the host device, and a set of conductive bumps on a second surface configured to mate with contacts of a memory array die of the group of one or more memory array dies.

9. The semiconductor device of claim 1, wherein the group of one or more second semiconductor dies comprise a three-dimensional stacked memory structure having strings of memory cells formed into layers.

10. A semiconductor device configured to operate with a host device, comprising:
a first wafer having a first major surface and comprising a first group of semiconductor dies having logic circuits for interfacing with the host device and logic circuits for interfacing with a memory array; and
a plurality of second wafers, physically and electrically coupled to the first wafer, the plurality of second wafers comprising a second group of semiconductor dies having a plurality of memory arrays;
wherein the plurality of second wafers are mounted to each other and the first wafer along an axis perpendicular to the major surface so that the logic circuits for interfacing with the memory array are electrically coupled with the plurality of memory arrays in the plurality of second wafers.

11. The semiconductor device of claim 10, wherein the first wafer comprises logic circuits for interfacing with the host device and logic circuits for interfacing with a memory array.

12. The semiconductor device of claim 10, wherein the first wafer comprises a first semiconductor die, the first semiconductor die comprising logic circuits for interfacing with the host device and logic circuits for interfacing with a memory array.

13. The semiconductor device of claim 12, wherein the plurality of second wafer comprise a plurality of second semiconductor dies, the plurality of second semiconductor dies each comprising a memory array.

14. The semiconductor device of claim 12, wherein the first semiconductor die and the plurality of second semiconductor dies are stacked on each other in a column.

15. The semiconductor device of claim 10, wherein the first wafer and the plurality of second wafers are stacked on top of each other to form a stack of wafers.

16. The semiconductor device of claim 15, wherein the first wafer is at the top of the stack of wafers.

17. The semiconductor device of claim 15, wherein the first wafer comprises a plurality of first semiconductor dies, and the plurality of second wafers each comprise a plurality of second semiconductor dies, wherein a first die of the plurality of first dies controls a group of second dies of the plurality of second dies.

18. The semiconductor device of claim 15, wherein group of second dies controlled by the first die are mounted in a column beneath the first die.

19. A semiconductor device configured to operate with a host device, comprising:
a controller wafer comprising a major surface and a plurality of controller semiconductor dies, each controller semiconductor die of the plurality of controller semiconductor dies comprising:
ASIC logic circuits for interfacing with the host device, the ASIC logic circuits provided at a first elevation along an axis perpendicular to the major surface within the controller wafer,
memory array logic circuits for interfacing with a memory array, the memory array logic circuit provided at a second elevation along the axis perpendicular to the major surface within the controller wafer, the second elevation being different than the first elevation; and
a plurality of memory array wafers, physically and electrically coupled to the first wafer along the axis perpendicular to the major surface, the plurality of memory array wafers each comprising a plurality of memory array semiconductor dies having memory arrays.

20. The semiconductor device of claim 19, wherein the plurality of memory array wafers are stacked on top of each other to form a stack of wafers, with memory array semiconductor dies of respective memory array wafers being physically and electrically bonded to each other in a column.

* * * * *